United States Patent
Gidon et al.

(10) Patent No.: US 8,587,080 B2
(45) Date of Patent: Nov. 19, 2013

(54) OPTICAL FILTERING MATRIX STRUCTURE AND ASSOCIATED IMAGE SENSOR

(75) Inventors: Pierre Gidon, Echirolles (FR); Gilles Grand, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 554 days.

(21) Appl. No.: 12/373,832

(22) PCT Filed: Jul. 17, 2007

(86) PCT No.: PCT/EP2007/057354
§ 371 (c)(1),
(2), (4) Date: Jan. 14, 2009

(87) PCT Pub. No.: WO2008/012235
PCT Pub. Date: Jan. 31, 2008

(65) Prior Publication Data
US 2009/0302407 A1 Dec. 10, 2009

(30) Foreign Application Priority Data
Jul. 25, 2006 (FR) ..................... 06 53093

(51) Int. Cl.
*H01L 31/0232* (2006.01)
(52) U.S. Cl.
USPC .......... 257/432; 257/431; 257/439; 257/440; 257/E31.127; 257/E51.018
(58) Field of Classification Search
USPC .............. 257/432, 431, 439, 440, 443, 444, 257/E31.127, E51.018
See application file for complete search history.

(56) References Cited

U.S. PATENT DOCUMENTS

| | | |
|---|---|---|
| 6,262,830 B1 | 7/2001 | Scalora |
| 2004/0056180 A1* | 3/2004 | Yu .............................. 250/214.1 |
| 2005/0003659 A1 | 1/2005 | Markowitz et al. |
| 2005/0122417 A1 | 6/2005 | Suzuki |
| 2006/0145223 A1 | 7/2006 | Ryu |
| 2007/0189625 A1* | 8/2007 | Battiato et al. ................ 382/250 |

FOREIGN PATENT DOCUMENTS

| | | |
|---|---|---|
| EP | 1 592 067 A1 | 11/2005 |
| JP | 01-271706 A | 10/1989 |
| JP | 04-053166 A | 6/1990 |

OTHER PUBLICATIONS

International Search Report for PCT/JP2007/057354.

* cited by examiner

*Primary Examiner* — Cathy N Lam
(74) *Attorney, Agent, or Firm* — Pearne & Gordon LLP

(57) ABSTRACT

The invention relates to an optical filtering structure consisting of a set of at least two elementary optical filters (R, V, B), an elementary optical filter being centered on an optimum transmission frequency, characterized in that it comprises a stack of n metal layers (m1, m2, m3) and n substantially transparent layers (d1, d2, d3) which alternate between a first metal layer (m1) and an $n^{th}$ substantially transparent layer (d3), the n metal layers (m1, m2, m3) each having a constant thickness and at least one substantially transparent layer having a variable thickness which sets the optimum transmission frequency of an elementary optical filter, n being an integer larger than or equal to 2.

Application to miniature image sensors.

14 Claims, 4 Drawing Sheets

OPTICAL FILTERING MATRIX STRUCTURE AND ASSOCIATED IMAGE SENSOR

TECHNICAL FIELD AND PRIOR ART

The invention relates to an optical filtering matrix structure and an image sensor which comprises an optical filtering matrix structure according to the invention.

The invention finds a particular advantageous application for producing image sensors of small dimensions such as for example, miniature camera image sensors of mobile telephones.

Obtaining images by an electronic sensor is in full development. The demand for simplification of the production of the sensors continues to be very strong. Charge coupled devices, more commonly called CCD sensors, are gradually replaced with active pixel sensors in CMOS technology, more commonly called CMOS APS (Active Pixel Sensor) sensors.

One of the important problems to be solved for an image sensor is that of obtaining colors. It is known that starting with three colors taken from the visible spectrum (red, green, blue), it is possible to record and to then reproduce the majority of colors.

Certain pieces of equipment begin by separating the three color bands and then direct the latter towards three image sensors. Others separate the colors directly at the surface of a single matrix of detectors: this second type of sensors is the one to which relates the invention.

For this second sensor type, two options may be contemplated:
- either building a very complex detection matrix making use in several levels of its structure of the fact that the different colors do not penetrate the same depth in the material in which the conversion of photons into electrons is performed (photosite);
- or adding sets of filters positioned as a matrix at the surface of a matrix of detectors.

The second option (adding sets of filters positioned as a matrix to the surface of a matrix of detectors) is the one which is the most used. The most standard matrix is then a matrix commonly called a Bayer matrix.

An example of a Bayer matrix, as seen from the top, is illustrated in FIG. 1. The Bayer matrix illustrated in FIG. 1 is a 2×2 (two lines×two columns) matrix. From left to right, the filters of the line of row 1 are green and red filters, respectively, and the filters of the line of row 2 are blue, green filters, respectively.

Producing such a filtering matrix is conventionally accomplished by using colored resins. In order to facilitate the production of the filtering matrix, one resorts to resins which are photosensitive to ultraviolet radiations, which may be removed in a developing bath there where they have not been insolated. For example, in order to produce a Bayer matrix according to the prior art, three layers of resin are successively deposited: one for green, one for red and one for blue. At each deposition, each of the resins is insolated through a mask and developed so that it only remains there where it should be placed.

The diagram of FIG. 2 illustrates a simplified structure of an APS CMOS sensor from the prior art. The CMOS APS sensor comprises a photosensitive semiconducting element 1, for example silicon, at the surface of which are formed photosensitive areas Zph and electronic circuits E1, a silica layer 2 in which electric interconnections 3 are integrated, which connect together the electronic circuits E1, resin layers forming blue filters B, red filters R and green filters V, a layer of resin 4 and a set of micro-lenses MC.

This sensor making technique is presently well under control. A drawback of this sensor however is its impossibility of filtering infrared. It is therefore necessary to add afterwards above the sensor, a glass sheet provided with a multilayer interferential filter for removing infrared.

Moreover, the resins are not very dense and it is presently necessary to lay a thickness of resin close to or larger than one micron in order to obtain a sufficient filtering effect. The size of the pixels of recent image sensors is consequently close to this size (typically 2 µm). This pixel size then poses a problem when the rays arrive with strong incidence at the surface of the sensor (image edge or strongly open objective). Indeed, the photons allowed to pass through a filter may then finish their course in the photosite of the neighboring filter. This phenomenon therefore considerably limits miniaturization.

The colored resins are also known for being easily inhomogeneous. Filtering inhomogeneity is therefore all the more marked since the pixels are small. This also represents another drawback.

Moreover, there are absorbent materials other than resins but, if they may be more absorbent, these materials pose too many problems in producing them for being compatible with a simple production of a matrix of integrated photosites, which production then becomes too expensive.

DISCUSSION OF THE INVENTION

The invention does not have the drawbacks mentioned above.

Indeed, the invention relates to an optical filtering structure consisting of a set of at least two elementary optical filters, one elementary optical filter being centered on an optimum transmission frequency, characterized in that it comprises a stack of n metal layers and n substantially transparent layers which alternate between a first metal layer and an $n^{th}$ substantially transparent layer, the n metal layers each having constant thickness and at least one substantially transparent layer having a variable thickness which sets the optimum transmission frequency of an elementary optical filter, n being an integer larger than or equal to 2.

According to an additional characteristic of the invention, n=2 and only one substantially transparent layer has variable thickness, the substantially transparent layer which has variable thickness being the substantially transparent layer located between the first metal layer and a second metal layer.

According to another additional characteristic of the invention, n=3 and two substantially transparent layers have variable thicknesses, a first substantially transparent layer which has variable thickness being the substantially transparent layer located between the first metal layer and a second metal layer and the second substantially transparent layer which has variable thickness being located between the second metal layer and a third metal layer, an overthickness resulting from a change in thickness of the first substantially transparent layer substantially being stacked with an overthickness resulting from a change in thickness of the second substantially transparent layer.

According to still another additional characteristic of the invention, the elementary optical filters are positioned as a matrix.

According to still another additional characteristic of the invention, the matrix is a Bayer matrix for filtering the three colors, red, green and blue.

According to another additional characteristic of the invention, the metal layers are in silver (Ag).

According to still another additional characteristic of the invention, the material which makes up the substantially transparent layers is selected from titanium dioxide (TiO$_2$), silica (SiO$_2$), silicon nitride (Si$_3$N$_4$), hafnium oxide (HfO$_2$).

The invention also relates to an optical sensor comprising an optical filtering structure and a photosensitive semiconducting substrate on which the optical filtering structure is deposited, characterized in that the optical filtering structure is a structure according to the invention, the first metal layer of which is deposited on a first face of the semiconducting substrate.

The invention also relates to an optical sensor comprising an optical filtering structure and a photosensitive semiconducting substrate on which the optical filtering structure is deposited, characterized in that the optical filtering structure is a structure according to the invention and in that the optical sensor comprises a barrier layer, a first face of which is deposited on a first face of the semiconducting substrate and a second face of which is in contact with the first metal layer of the optical filtering structure.

According to an additional characteristic of the invention, the barrier layer is made in a material identical with the material which forms the substantially transparent layers of the optical filtering structure.

According to another additional characteristic of the invention, the barrier layer is partly or totally electrically conducting.

According to another additional characteristic of the invention, the material of the barrier layer is indium-doped tin oxide (ITO) in the electrically conducting portions and silica (SiO$_2$) or silicon nitride (Si$_3$N$_4$) in the portions which are not electrically conducting.

According to another additional characteristic of the invention, photosensitive areas and electronic components are formed on the first face of the photosensitive semiconductor.

According to another additional characteristic of the invention, photosensitive areas and electronic components are formed on a second face of the photosensitive semiconductor, opposite to the first face.

Multilayer filters consisting of an alternation of transparent layers and of metal layers are known for making structures with a photonic forbidden band, more commonly called PBG (Photonic Band Gap) structures. U.S. Pat. No. 6,262,830 discloses metal-dielectric transparent structures with a photonic forbidden band.

The metal-dielectric transparent structures with a photonic forbidden band disclosed in U.S. Pat. No. 6,262,830 consist of the superposition of a plurality of transparent dielectric layers with a thickness close to one half-wavelength separated by thin metal layers. The thickness of each dielectric or metal layer is uniform. These structures are designed in order to let through certain frequency bands and to block other ones. A drawback of these structures is that they absorb a portion of the light, including in the areas where it would be desired that they be transparent.

In an unexpected way for one skilled in the art, it appeared that the invention produces an optical filtering structure adapted to the transmission of certain particular frequencies by a change in the thickness of only one or two transparent layers, whereas, moreover, all the other layers are of constant thickness. As seen in a sectional view, the transparent layer(s) with variable thickness vary stepwise depending on their position in the matrix.

Advantageously, an optical filtering structure according to the invention, for example a Bayer matrix, may then be such that all the elementary optical filters of the matrix have a smaller thickness than the shortest of the useful wavelengths.

SHORT DESCRIPTION OF THE FIGURES

Other characteristics and advantages of the invention will become apparent upon reading preferential embodiments of the invention made with reference to the appended figures, wherein:

FIG. 1, already described, illustrates a top view of a Bayer matrix according to the prior art;

FIG. 2, already described, illustrates a sectional view of a CMOS APS sensor according to the prior art;

In all the figures, the same references designate the same elements.

DETAILED DESCRIPTION OF EMBODIMENTS OF THE INVENTION

Figure 1:
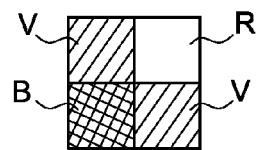
Figure 3:
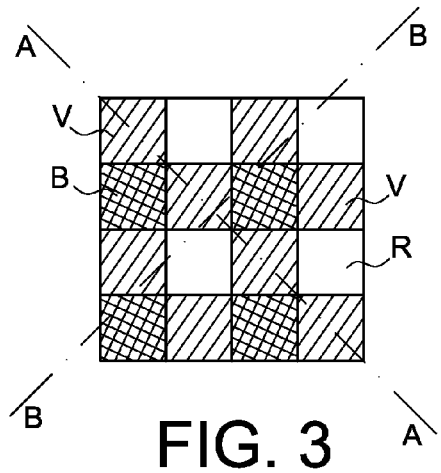
FIG. 3 illustrates a top view of an optical filtering matrix structure according to the invention.

FIG. 3 illustrates a top view of an optical filtering matrix structure according to the invention. As seen from above, the optical filtering matrix structure of the invention has a geometry obtained by repeating the basic structure from the prior art illustrated in FIG. 1. Filtering cells R, V, B for selecting the colors red, green and blue, respectively, are placed one beside another.

Figure 4A:
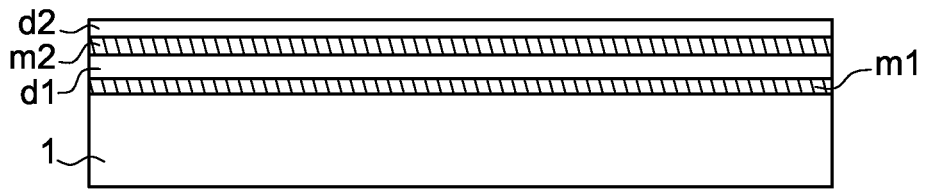
FIGS. 4A and 4B illustrate sectional views along two different axes of an optical filtering matrix structure according to a first embodiment of the invention.
Figure 4B:
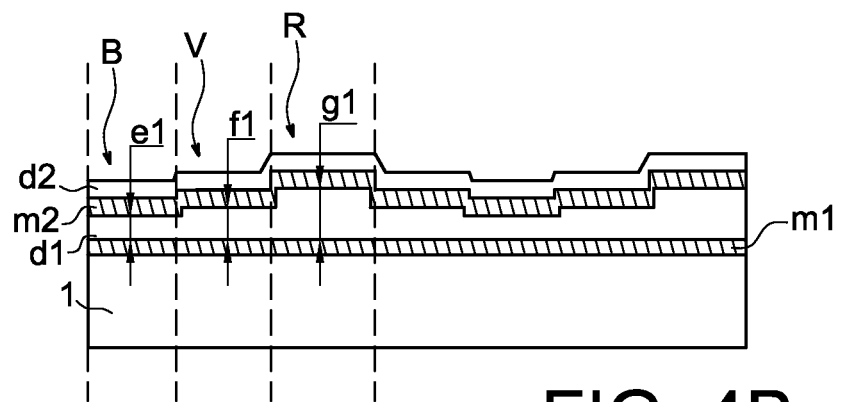

FIGS. 4A and 4B illustrate sectional views, along two different axes, of an optical filtering matrix structure according to a first embodiment of the invention. With reference to FIG. 3, FIG. 4A is a sectional view along the axis AA of FIG. 3 and FIG. 4B is the sectional view along the axis BB of FIG. 3. The AA axis diagonally cuts the green optical filters V. The BB axis is an axis perpendicular to the AA axis and cuts, outside the diagonals, successive blue B, green V, red R, green V, blue B, green V, red R, etc. optical filters.

The image sensor comprises a photosensitive semiconducting element 1, for example silicon, on which a first metal layer m1, a first transparent layer d1, a second metal layer m2 and a second transparent layer d2 are successively laid. The metal used for producing the metal layers m1 and m2 is silver (Ag) for example and the material used for producing the transparent layers d1 and d2 is a dielectric for example, which may be titanium dioxide (TiO$_2$) for example.

The layer d1 is an adjustment layer, the change in thickness of which changes the different transmission wavelengths of the filter, all the other layers having constant thickness. The change in thickness of the layer d1 is thus adapted to selective transmission of the blue color (thickness e1), of the green color (thickness f1) and of the red color (thickness g1).

In the particular case when the metal layers m1 and m2 are silver layers (Ag) and the transparent layers d1 and d2 are titanium dioxide (TiO$_2$) layers, the thicknesses of the layers m1, m2 and d2 are equal, for example to 27 nm, 36 nm and 41 nm, respectively and the thickness of the layer d1 varies between 50 nm and 90 nm, i.e.: 52 nm for blue, 70 nm for green, 87 nm for red.

The thicknesses of the layers would assume different values with other materials. As non-limiting examples, the metal layers may be made with Ag, Al, Au, Nb, Li and the transparent layers may be made with TiO$_2$, ITO, SiO$_2$, Si$_3$N$_4$, MgF$_2$, SiON, Al$_2$O$_3$, HfO$_2$. Generally, the thicknesses of the layers m1, d1, m2, d2 are calculated with algorithms for multilayer filter calculations.

It should be noted here that, in FIGS. 4A and 4B (and this is the same for the whole of the other figures), the thickness of the layer is deliberately enlarged so as to better view the changes in thickness.

Figure 5:
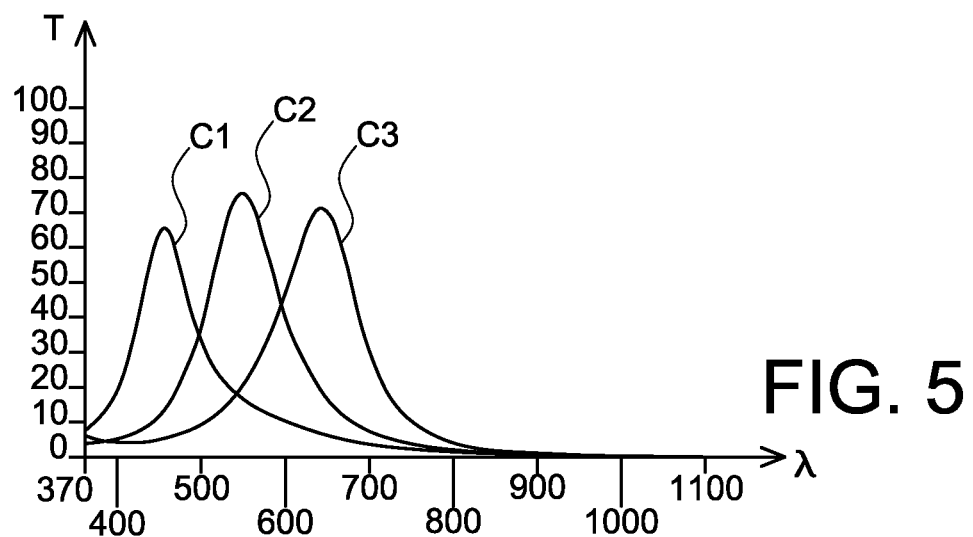
FIG. 5 illustrates the performances of optical filtering of an optical filtering matrix structure according to the first embodiment of the invention.

FIG. 5 illustrates the optical filtering performances of a filtering matrix structure according to the first embodiment of the invention. Three curves are illustrated in FIG. 5, i.e. a transmission curve C1 relative to the blue color (for blue filters), a transmission curve C2 relative to the green color (for green filters) and a transmission curve C3 relative to the red color (for red filters). The curves C1, C2, C3 illustrate the transmission coefficient of the matrix structure expressed as percentages depending on the wavelength λ expressed in nm.

Not only the excellent quality of the transmission results obtained with only four layers (a transmission attaining substantially 70%), should also be noted here but also the excellent rejection of infrared waves beyond 900 nm.

Moreover, the optical filters only show one transmission peak between the near ultraviolet (400 nm) and infrared (1100 nm). This is also an advantage as compared with the dielectric structures of the prior art which already have parasitic transmission in the near infrared (>800 nm).

Figure 6A:
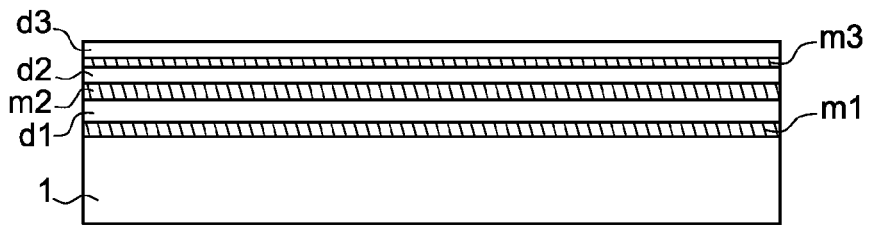
FIGS. 6A and 6B illustrate sectional views along two different axes of an optical filtering matrix structure according to a second embodiment of the invention.
Figure 6B:
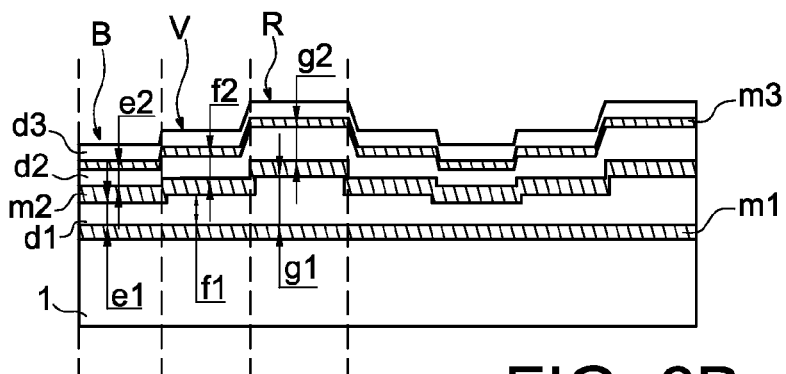

FIGS. 6A and 6B illustrate sectional views, along two different axes of an optical filtering matrix structure according to a second embodiment of the invention. With reference to FIG. 3, FIG. 6A is a sectional view along the AA axis and FIG. 6B is a sectional view along the BB axis.

The image sensor comprises a photosensitive semiconducting element 1, for example silicon, on which three metal layers m1, m2, m3 and three transparent layers d1, d2, d3 are alternately laid, the metal layer m1 being in contact with the semiconducting element 1. The metal layers m1-m3 are in silver (Ag) for example, and the transparent layers d1-d3 are in titanium dioxide (TiO$_2$) for example.

The layers d1 and d2 are adjustment layers, of which the changes in thickness set the different transmission wavelengths of the filter, all the other layers having a constant thickness. An overthickness resulting from a change in thickness of the layer d1 coincides with an overthickness resulting from a change in thickness of the layer d2 (the overthicknesses are stacked). The layer d3 is an antireflection layer. The changes in thickness of the layers d1 and d2 are thus adapted to selective transmission of the different colors:
- a thickness e1 of the layer d1 and a thickness e2 of the layer d2 are associated for selective transmission of the blue color;
- a thickness f1 of the layer d1 and a thickness f2 of the layer d2 are associated for selective transmission of the green color; and
- a thickness g1 of the layer d1 and a thickness g2 of the layer d2 are associated for selective transmission of the red color.

In the particular case of metal layers in silver (Ag) and of transparent layers in titanium dioxide (TiO$_2$), the thicknesses of the layers m1, m2, m3 and d3 are for example equal to 23 nm, 39 nm, 12 nm and 65 nm, respectively, the thicknesses of the layers d1 and d2 being comprised between 50 nm and 100 nm, i.e.:

|  | d$_1$ | d$_2$ |
| --- | --- | --- |
| Blue | 52 nm | 51.4 nm |
| Green | 70 nm | 73.5 nm |
| Red | 87.5 nm | 96 nm |

Figure 7:
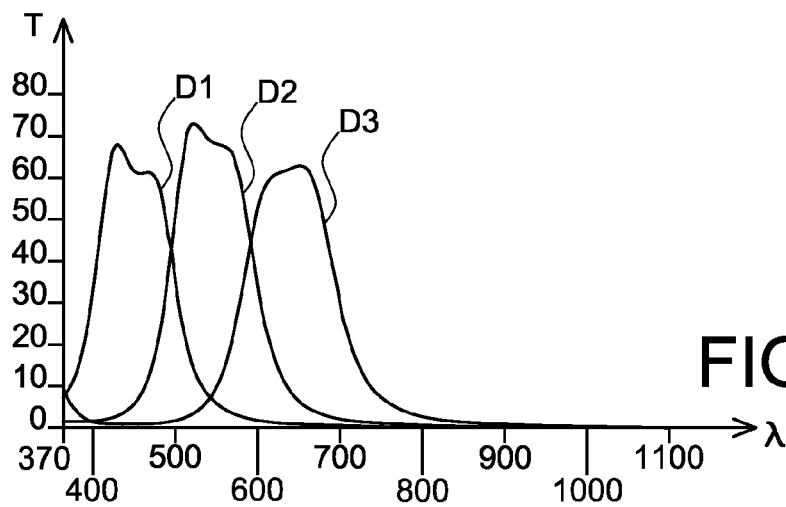
FIG. 7 illustrates the optical filtering performances of an optical filtering matrix structure according to the second embodiment of the invention.

The transmission spectrum resulting from this matrix structure is illustrated in FIG. 7. The curves D1, D2, D3 represent the transmission coefficient T of the matrix structure expressed as percentages depending on the wavelength λ expressed in nm. At the central wavelengths which correspond to the three desired colors (red, green, blue), transmission is substantially comprised between 60 and 70%.

Figure 8:
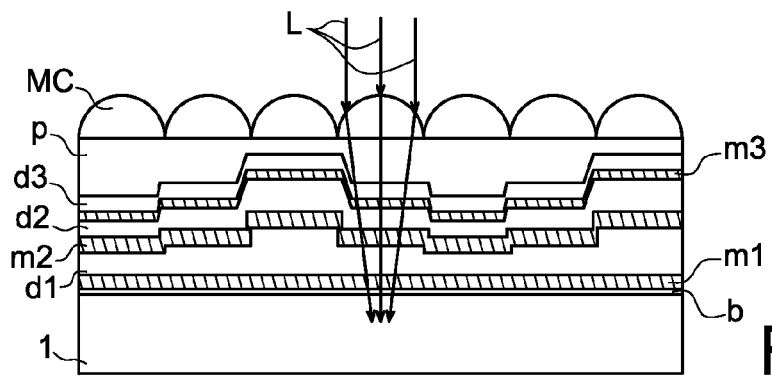
FIG. 8 illustrates a sensor block sectional view which uses an optical filtering matrix structure according to the second embodiment of the invention.

FIG. 8 illustrates a sectional view of an enhancement of an optical filtering matrix structure according to the second embodiment of the invention. The matrix structure is here equipped with a set of micro-lenses MC which focus the light L in the photosites. In a way known per se, the MC microlenses are placed on a planarization layer p.

In addition to the elements already described with reference to FIGS. 6A and 6B, the set of micro-lenses MC and the planarization layer p, the matrix structure of the invention here comprises a barrier layer b which protects the semiconductor 1 from the metal layer m1. The barrier layer b then prevents the semiconductor 1 from being contaminated by the metal layer m1 (pollution by migration of metal ions into the semiconductor). In the case when, for example, the metal is silver (Ag), with a silica barrier layer or a layer of indium-doped tin oxide (ITO) (Indium Tin Oxide) the desired protection may be achieved. The thickness of the silica layers or of ITO is, for example, equal to 10 nm.

The barrier layer b may be non-conducting (this is the case of silica SiO$_2$ and of silicon nitride Si$_3$N$_4$), conducting (this is the case of ITO) or partly conducting. When it is conducting, the barrier layer b may advantageously be used as an electrode at the surface of the semiconductor 1. Advantageously, in the case when the barrier layer is an ITO barrier, ITO may also be used for making the transparent layers of the structure, ITO being transparent. The layers b, d1, d2, d3 are then in ITO and the layers m1, m2, m3 are in Ag. Two materials (Ag and ITO) are then sufficient for making the structure according to the invention in which the photosensitive semiconductor is protected from a contact with metal. It is also possible to replace the silver with a less contaminating metal alloy for the semiconductor but still having good index properties. The metal alloy and ITO are then also sufficient for making a structure according to the invention, in which the photosensitive semiconductor is protected.

Figure 9:
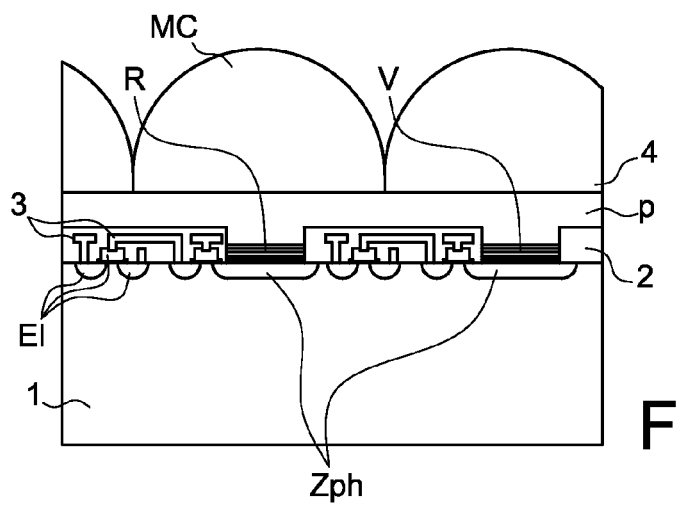
FIG. 9 illustrates a first alternative sensor according to the invention.
Figure 10:
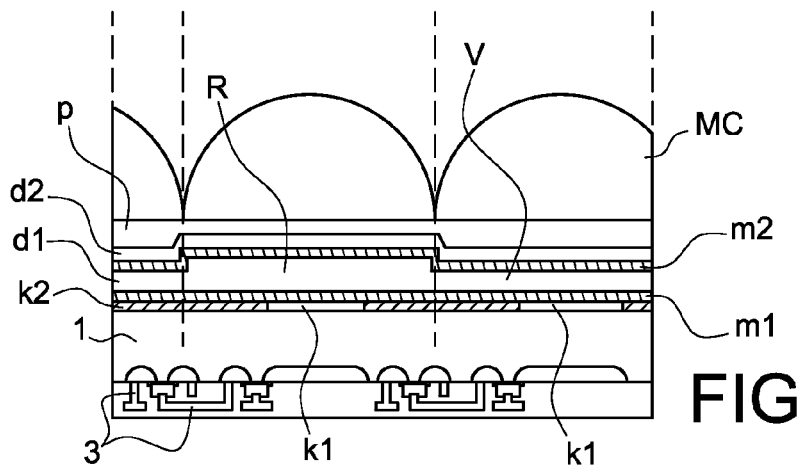
FIG. 10 illustrates a first alternative sensor according to the invention.

FIGS. 9 and 10 illustrate two alternative optical sensors according to the invention.

FIG. 9 illustrates an optical sensor in which light arrives on the face of the photosensitive semiconductor on which the photosensitive areas Zph and electronic circuits E1 are formed. In this type of optical sensor, light should avoid the metal interconnections 3. The optical filters of the invention are generally much thinner than the filters of the prior art. It is then advantageous to place the filters as close as possible to the photosensitive areas Zph, between the interconnections 3.

Figure 2:
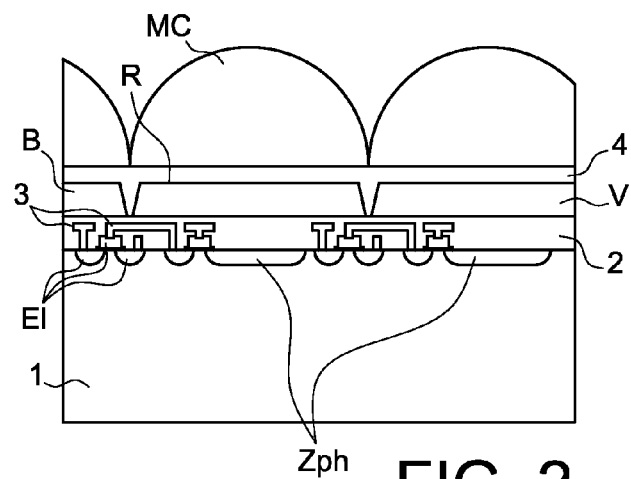

Comparatively to the corresponding structure of the prior art (cf. FIG. 2), the optical sensor accordingly has better insensitivity to the incidence of the light.

FIG. 10 illustrates an optical sensor in which light arrives on the face of the photosensitive semiconductor which is opposite to the face on which the photosensitive areas Zph and the electronic circuits E1 are formed. The optical filtering matrix of the invention is very easily adapted to this type of sensor. Here also, the optical sensor of the invention has an advantageously smaller thickness than a corresponding optical sensor of the prior art. Moreover, in certain applications, the proximity of the optical filters advantageously allows the micro-lenses MC to be suppressed.

According to a particular embodiment, the sensor illustrated in FIG. 10 comprises, between the semiconductor 1 and the first metal layer m1, a barrier layer b provided with electrically conducting areas k1 and electrically insulating areas k2. The conducting k1 and insulating k2 areas enable electric contact to be established at the desired locations.

The two particular structures illustrated in FIGS. 9 and 10 advantageously have a transmission spectrum which varies very little with the angle of incidence of the light. Thus, for example, a green filter ($TiO_2$/Ag) having a filter bandwidth of 90 nm has its average wavelength vary by substantially 20 nm when the incidence varies from 0° to 40°. Comparatively, this change would be 38 nm for a multilayer filter of the prior art ($SiO_2$/$TiO_2$).

Another advantage of the filtering structures of the invention is that they may be made with materials such as silver and ITO which are electric conductors, so that the filter may play the role of an electrode, this electrode being able to have several points of contact with the underlying circuit (El, Zph).

Technological making of the filtering structures and of the sensors of the invention is rather simple and makes use of usual manufacturing processes from the field of micro-electronics.

Preferentially, the transparent layers and the metal layers are made by vacuum sputtering but other techniques are also possible such as for example vacuum evaporation. Control of the thickness is accomplished by knowing the rate of the depositions.

The method for making an exemplary optical filtering structure with a single transparent layer of variable thickness is described hereafter.

On a photosensitive semiconducting substrate are successively deposited a protective layer ($SiO_2$), a metal layer (silver) and a transparent material layer (ITO). Two steps of photolithography-etching are then carried out. Masking of the areas which should not be etched is made with resin. Etching is accomplished, preferably, as a reactive ionic etching (for example under chlorine+HBr gases for etching ITO). The point for stopping the etching is determined by an interferometer. As a non-limiting example, from an ITO layer with a thickness of 90 nm, it is possible to obtain an ITO thickness of 70 nm for green, 50 nm for blue, the initial thickness of 90 nm being kept for red. A silver layer (Ag) and an ITO layer each having a constant thickness, are then deposited successively.

The method for making an exemplary optical filtering structure with two transparent layers of variable thicknesses is described hereafter.

The method is almost identical with the one described above for a single transparent layer of variable thickness, i.e.:
depositing three first layers (protective $SiO_2$ layer, first Ag layer, first ITO layer);
carrying out two photolithography-etching steps for producing the transparent steps of the first ITO layer;
depositing the two following layers (second Ag layer, second ITO layer);
carrying out two new photolithography-etching steps for producing the transparent steps of the second transparent layer;
depositing the two last layers of constant thickness (Ag, ITO).

As this has already been mentioned earlier, advantageously, the invention provides that the protective layer may be more complicated to produce than a simple dielectric layer. For example, if the intention is to use an elementary filter as a conducting electrode, then it is mandatory to replace the insulating protective layer with a conducting protective layer at the locations where the protective layer is in electric contact with the photosensitive semiconductor.

Producing such a layer with two materials, for example $SiO_2$ for producing the insulating areas and ITO for producing the conducting areas, is conducted in four steps, i.e.:
depositing a $SiO_2$ layer;
photolithography and etching of $SiO_2$ where the intention is to put ITO;
depositing an ITO layer a little thicker than the $SiO_2$ layer;
mechano-chemical planarization removing ITO as far as the surface of the $SiO_2$.

The invention claimed is:

1. An optical filtering structure consisting of a set of at least two elementary optical filters (Red, Green, Blue) or (R, V, B), an elementary optical filter being centered on a central transmission frequency, wherein the elementary optical filter comprises a stack of n metal layers (m1, m2, m3) and n substantially transparent layers (d1, d2, d3) which alternate between a first metal layer (m1) and an $n^{th}$ substantially transparent layer (d3), each of the n metal layers (m1, m2, m3) having a constant thickness and at least one substantially transparent layer having a variable thickness which sets the central transmission frequency of the elementary optical filter, n being an integer larger than or equal to 2.

2. The optical filtering structure according to claim 1, wherein n=2 and wherein a single substantial transparent layer has a variable thickness, the substantially transparent layer which has the variable thickness being the substantially transparent layer located between the first metal layer (m1) and a second metal layer (m2).

3. The optical filtering structure according to claim 1, wherein n=3 and wherein two substantially transparent layers have the variable thickness, a first substantially transparent layer which has the variable thickness being the substantially transparent layer located between the first metal layer (m1) and a second metal layer (m2) and the second substantially transparent layer which has the variable thickness being located between the second metal layer and a third metal layer (m3), an overthickness resulting from a change in thickness of the first substantially transparent layer substantially stacked with an overthickness resulting from a change in thickness of the second substantially transparent layer.

4. The optical filtering structure according to any of the preceding claims, wherein the elementary optical filters (R, V, B) are arranged as a matrix.

5. The optical filtering structure according to claim 4, wherein the matrix is a Bayer matrix for filtering the three colors, red, green and blue.

6. The optical filtering structure according to any of the preceding claims, wherein the metal layers are in silver (Ag).

7. The optical filtering structure according to any of the preceding claims, wherein a material which makes up the substantially transparent layers is selected from titanium dioxide (TiO$_2$), indium-doped tin oxide (ITO), silica (SiO$_2$), silicon nitride (Si$_3$N$_4$), hafnium oxide (HfO$_2$).

8. An optical sensor comprising an optical filtering structure and a photosensitive semiconducting substrate (1) on which is deposited the optical filtering structure, characterized in that the optical filtering structure is a structure according to any of claims 1 to 7, the first metal layer (m1) being deposited on a first face of the semiconducting substrate (1).

9. The optical sensor comprising an optical filtering structure and a photosensitive semiconducting substrate (1) on which is deposited the optical filtering structure, characterized in that the optical filtering structure is a structure according to any of claims 1 to 7 and in that it comprises a barrier layer (b), a first face of which is deposited on a first face of the semiconducting substrate (1) and a second face of which is in contact with the first metal layer (m1).

10. The optical sensor according to claim 9, wherein the barrier layer is made in a material identical with the material which makes up the substantially transparent layers of the optical filtering structure.

11. The optical sensor according to claim 9 or 10, wherein the barrier layer (b) is partly or totally electrically conducting.

12. The optical sensor according to claim 11, wherein the material of the barrier layer is indium-doped tin oxide (ITO) in an electrically conducting portion and silica (SiO$_2$) or silicon nitride (Si$_3$N$_4$) in a portions which are not electrically conducting.

13. The optical sensor according to any of claims 8 to 12, wherein photosensitive areas (Zph) and electronic components (El) are formed on a first face of the photosensitive semiconductor.

14. The optical sensor according to any of claims 8 to 12, wherein photosensitive areas (Zph) and electronic components (El) are formed on a second face of the photosensitive semiconductor (1), opposite to the first face of the photosensitive semiconductor.

\* \* \* \* \*